INSULATED GATE FIELD EFFECT TRANSISTOR GATE RETURN
Filed March 31, 1964
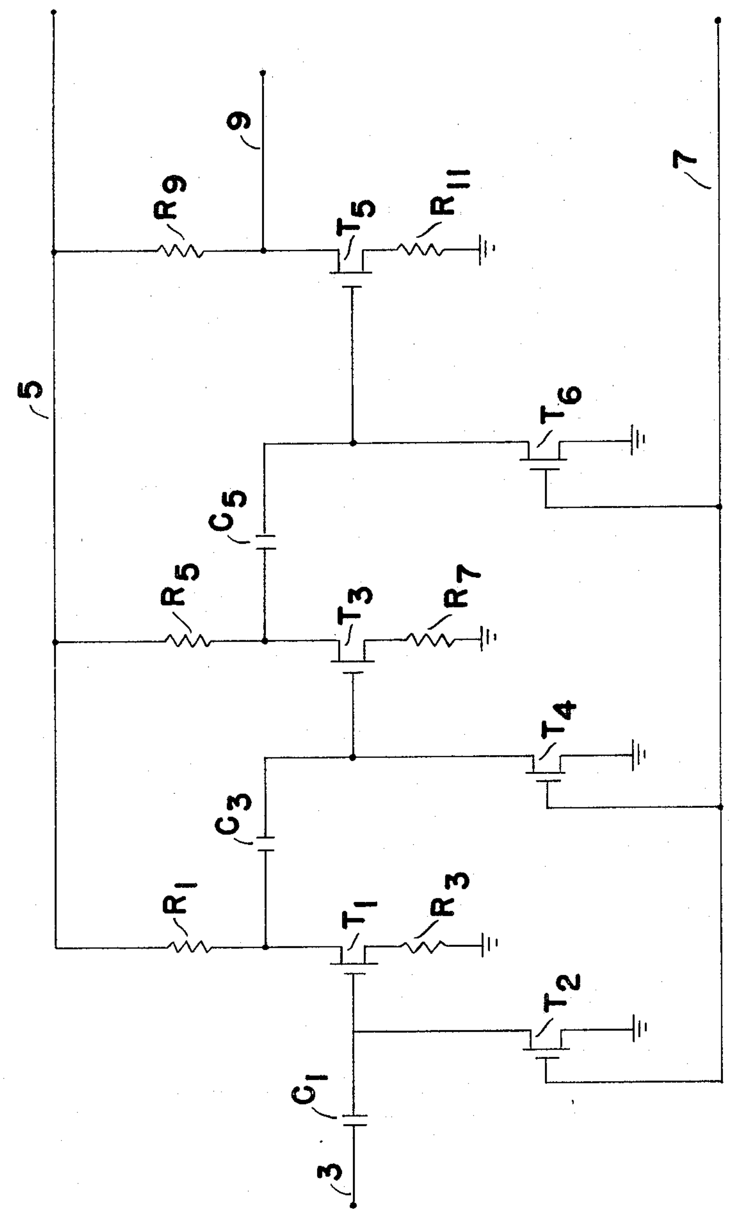
INVENTOR.
LOUIS SICKLES II
BY
Arthur L. Collins
ATTORNEY United States Patent Office 3,296,547 Patented Jan. 3, 1967

3,296,547

INSULATED GATE FIELD EFFECT TRANSISTOR GATE RETURN

Louis Sickles II, Philadelphia, Pa., assignor, by mesne assignments, to the United States of America as represented by the Secretary of the Navy Filed Mar. 31, 1964, Ser. No. 356,334
1 Claim. (Cl. 330—35)

The present invention relates to novel and improved electronic resistance-capacitance coupling networks and more particularly to a novel and improved resistance-capacitance coupling circuit which may be readily integrated in a miniature silicon wafer or block.

In the manufacture of various types of electronic and computer circuitry, it often becomes important to reduce the size and weight of the equipment to a minimum. Significant progress has been made recently in this area in the development and use of transistors, transistorized circuits, and particularly integrated transistorized circuits in which a plurality of electronic components and circuits are fabricated in a unitary silicon wafer or block.

Recent development of the insulated gate field effect transistor has further extended the application and use of the transistor in various types of miniaturized electronic circuits. In this relatively new type of transistor, a thin strip of insulating material is placed between the semiconductor and an evaporated metallic film. The parallel plate capacitor which is formed in this way is used to provide an external electric field normal to the lateral surface of the semiconductor which controls carrier density in the channel of the transistor between its source and drain. This is accomplished with little or no transistor gate current.

The gate of the insulated gate field effect transistor, however, must not be permitted to float. It must be returned to either the source or the drain through some resistance element. This resistance can be very high in value since as indicated above, the gate leakage current is negligible. Nevertheless, a return resistance path must be provided so that stray charges are dissipated from the gate of the transistor.

It is therefore a principal object of the present invention to provide a novel and improved return for the gate of an insulated gate field effect transistor.

It is a further object of the present invention to provide novel and improved integrated circuitry for returning the gate of an insulated gate field effect transistor to its source or drain.

Other objects and many of the attendant advantages of this invention will be readily appreciated as the same becomes better understood by reference to the following detailed description when considered in connection with the accompanying drawing wherein:

The single figure of the drawing is a circuit diagram of a preferred embodiment of the present invention as it might be utilized in a resistance-capacitance coupled amplifier.

In general, the improved electronic return circuit for the gate of an active insulated gate field effect transistor includes a second insulated gate field effect transistor, means connecting the source to drain channel of the second transistor between the gate of the active transistor and ground, and means for maintaining the gate of the second transistor at a predetermined negative potential. It has been found that a ground return of this kind can be readily incorporated in an integrated transistorized circuit.

A preferred embodiment of the present invention is illustrated in the single figure of the drawing. As shown therein, the input signal on conductor 3 which is to be amplified is coupled to the gate of the insulated gate field effect transistor T–1 through condenser C–1. The source to drain circuit of transistor T–1 extends from the power supply line 5 through load resistor R–1, the transistor and resistor R–3 to ground. The gate of transistor T–1 is coupled to ground through the source to drain circuit of the insulated gate field effect transistor T–2. The gate of transistor T–2 is connected to the negative potential supply line 7. The source of transistor T–1 is coupled to the gate of insulated gate field effect transistor T–3 through condenser C–3. The source to drain circuit of transistor T–3 extends from the power supply line 5 through load resistor R–5, the transistor and resistor R–7 to ground. The gate of transistor T–3 is coupled to ground through the source to drain circuit of insulated gate field effect transistor T–4. The gate of transistor T–4 is connected to the negative potential supply line 7. The source of transistor T–3 is coupled to the gate of insulated gate field effect transistor T–5 through condenser C–5. The source to drain circuit of transistor T–5 extends from the power supply line 5 through load resistor R–9, the transistor and resistor R–11 to ground. The gate of transistor T–5 is coupled to ground through the source to drain circuit of insulated gate field effect transistor T–6. The gate of transistor T–6 is connected to the negative potential supply line 7. The amplified output signal is provided at the source of transistor T–5 on conductor 9.

In operation, the signal which is to be amplified is applied to the gate of transistor T–1 through condenser C–1.

Variation of the gate potential of transistor T–1 enhances and/or depletes the supply of carriers in the channel of the semiconductor of transistor T–1. Flow of current through the channel of transistor T–1 is therefore proportionately controlled and amplified. The signal across load resistor R–1 is then similarly amplified in the circuits of transistors T–3 and T–5 and the desired output signal of the amplifier is obtained at the source of transistor T–5 on conductor 9. The gate circuits of transistors T–1, T–3 and T–5 carry little if any gate current but are returned to ground through transistors T–2, T–4 and T–6 such that any stray charges developed on the gates of transistors T–1, T–3 and T–5 are dissipated. By selecting the negative potential at the gates of transistors T–2, T–4 and T–6, a suitable desired high resistive path to ground through the channels of transistors T–2, T–4 and T–6 is easily obtained.

The above described transistorized gate return circuit can be readily fabricated in an integrated silicon wafer or block or the like. Moreover, when it is used in an R.C. coupled amplifier as described hereinabove, a good flat frequency response can be obtained. Thus, for example, when the input coupling condensers C–1, C–3 and C–5 are 47 mmfd., the potential on supply line 7 is minus 12 volts, the source resistors are 18000 ohms and the drain resistors are 1000 ohms, it has been found that a 3 db bandwidth of the amplifier extended down to 10 cps.

Although the improved integrated gate return circuit of the present invention has been described herein as it might be used in an R.C. coupled amplifier, it is to be understood that it could be used in any other suitable electronic application without departing from the spirit or scope of the invention.

Obviously many modifications and variations of the present invention are possible in the light of the above teachings. It is therefore to be understood that within the scope of the appended claim, the invention may be practiced otherwise than as specifically described.

What is claimed is:

In a resistance-capacitance coupled amplifier:

(a) an A.C. input signal source;

(b) a first insulated gate field effect transistor;

(c) a high capacitance condenser connected between the A.C. signal source and the gate of the first insulated gate field effect transistor;

(d) a second insulated gate field effect transistor;

(e) means connecting the channel of the second insulated gate field effect transistor between the gate of the first insulated gate field effect transistor and ground; and (f) means for applying a predetermined negative potential at the gate of the second insulated gate field effect transistor.

References Cited by the Examiner

UNITED STATES PATENTS

| | | | |
|---|---|---|---|
| 3,131,312 | 4/1964 | Puzrath. | |
| 3,191,061 | 6/1965 | Weimer. | |
| 3,222,610 | 12/1965 | Evans et al. | |
| 3,229,218 | 1/1966 | Sickles et al. | 330—29 |

OTHER REFERENCES

Bignell: How To Get Maximum Input Impedance with Field-Effect Transistors, Electronics, pp. 44–46, March 8, 1963.

ROY LAKE, *Primary Examiner.*

N. KAUFMAN, F. D. PARIS, *Assistant Examiners.*